United States Patent [19]

Nizaka

[11] Patent Number: 5,293,561
[45] Date of Patent: Mar. 8, 1994

[54] WRITE-IN VOLTAGE SOURCE INCORPORATED IN ELECTRICALLY ERASABLE PROGRAMMABLE READ ONLY MEMORY DEVICE WITH REDUNDANT MEMORY CELL ARRAY

[75] Inventor: Minoru Nizaka, Kanagawa, Japan

[73] Assignee: NEC Corporation, Tokyo, Japan

[21] Appl. No.: 835,335

[22] Filed: Feb. 14, 1992

[30] Foreign Application Priority Data

Feb. 15, 1991 [JP] Japan .................................. 3-042982

[51] Int. Cl.$^5$ .............................................. G11C 7/00
[52] U.S. Cl. .............................. 365/189.11; 365/156; 365/189.09; 365/190; 365/201
[58] Field of Search ...................... 365/189.09, 189.11, 365/201, 230.03, 190, 156

[56] References Cited

FOREIGN PATENT DOCUMENTS 3-147598 6/1991 Japan ............................. 365/189.11

Primary Examiner—Joseph E. Clawson, Jr.
Attorney, Agent, or Firm—Sughrue, Mion, Zinn, Macpeak & Seas

[57] ABSTRACT

A write-in voltage source is incorporated in an electrically erasable read only memory device for supplying a write-in voltage level to memory circuits of a redundant unit as well as a data storage, and comprises a first control circuit responsive to a first instruction signal indicative of a power voltage level or a write-in voltage level and producing first and second control signals complementary to each other, a second control circuit responsive to a second instruction signal indicative of a ground voltage level and producing third and fourth control signals complementary to each other, a first level-shifting circuit responsive to the first to third control signals and producing one of the write-in voltage level, the power voltage level and the ground voltage level, and a second level-shifting circuit responsive to the first, second, and fourth control signals and producing one of the write-in voltage level, the power voltage level and the ground voltage level so that the first and second level-shifting circuits independently supply the designated voltage levels to the memory circuits and the data storage.

7 Claims, 3 Drawing Sheets

5,293,561

WRITE-IN VOLTAGE SOURCE INCORPORATED IN ELECTRICALLY ERASABLE PROGRAMMABLE READ ONLY MEMORY DEVICE WITH REDUNDANT MEMORY CELL ARRAY

FIELD OF THE INVENTION

This invention relates to an electrically erasable read only memory device and, more particularly, to a write-in voltage source incorporated in the electrically erasable read only memory device with a redundant memory cell array.

DESCRIPTION OF THE RELATED ART

An electrically programmable read only memory device has been increased in memory capacity, and a redundant technology improves the production yield of the electrically programmable read only memory device. Namely, a redundant memory cell array is provided in association with the regular memory cell array, and defective regular memory cells are replaced with the redundant memory cells for rescuing the defective product from rejection. The row or column address of the defective regular memory cells are memorized in a redundant unit associated with the redundant memory cell array, and the redundant unit allows an external device to communicate with the redundant memory upon access to one of the defective regular memory cells. For this reason, the redundant memory unit has memory circuits so as to store the row or column address assigned to the defective regular memory cells, and the memory circuits are usually implemented by breakable polysilicon fuse elements or electrically programmable memory cells. Although dynamic random access memory device are frequently employed with the memory circuits with the breakable polysilicon fuse elements, the memory circuits with the electrically programmable memory cells are usually incorporated in the electrically programmable read only memory device. The electrically programmable memory cells stores the row or column addresses in a non-volatile manner, and are under the control of a write-in voltage source for selectively entering write-in state.

A typical example of the write-in voltage source is illustrated in FIG. 1 of the drawings, and the write-in voltage source is shared between the electrically programmable memory cells of the redundant unit (not shown) and the electrically programmable read only memory cells of the data storage (not shown). The write-in voltage source largely comprises a level-shifter 1 associated with a control circuit 2, and the level shifter 1 is implemented by a series combination of n-channel depletion type field effect transistors 1a and 1b coupled between a source of power voltage source Vcc and a variable voltage source Vx. The power voltage level Vcc and a write-in voltage level Vpp are selectively supplied to the variable voltage source Vx, and the write-in voltage level Vpp is much higher than the power voltage level Vcc.

The control circuit 2 is responsive to a write-in control signal CTL1, and comprises an inverting circuit 2a supplied with the write-in control signal CTL1, and two series combinations of p-channel enhancement type field effect transistors 2b and 2c and n-channel enhancement type field effect transistors 2d and 2e coupled in parallel between the variable voltage source Vx and a source of ground voltage GND. The common drain nodes N1 and N2 of the two series combinations serve as a pair of output nodes of the control circuit 2, and are coupled in parallel with the gate electrodes of the n-channel depletion type field effect transistors 1a and 1b. The p-channel enhancement type field effect transistors 2b and 2c are gated by the common drain nodes N2 and N1, respectively, and the gate electrodes of the n-channel enhancement type field effect transistors 2d and 2e are respectively coupled with the output node and the input node of the inverting circuit 2a.

The write-in voltage source thus arranged behaves as follows. While the electrically programmable read only memory device is in the write-in mode of operation on either memory circuits or data storage, the write-in control signal CTL1 is decayed to the ground voltage level, and the variable voltage source Vx is elevated to the write-in voltage level Vpp. The write-in control signal CTL1 of the ground voltage level is directly supplied to the gate electrode of the n-channel enhancement type field effect transistor 2e, and the inverting circuit 2a supplies the complementary write-in control signal CCTL1 of the power voltage level Vcc to the gate electrode of the n-channel enhancement type field effect transistor 2d. The n-channel enhancement type field effect transistor 2d turns on to pull down the common drain node N1 to the ground voltage level, and the other n-channel enhancement type field effect transistor 2e turns off so that the common drain node N2 is lifted to the power voltage level Vcc. The p-channel enhancement type field effect transistors 2b and 2c maintain the voltage levels at the common drain nodes N1 and N2, and are relayed to the n-channel depletion type field effect transistors 1a and 1b, respectively. With the positive voltage level Vcc at the common drain node N2, the n-channel depletion type field effect transistor 1b remains in the on-state, however, the ground voltage level at the common drain node N1 allows the n-channel depletion type field effect transistor 1a to turn off. Then, the write-in voltage level Vpp is supplied to the memory circuits of the redundant unit as well as the data storage.

If the electrically programmable read only memory device enters a read-out mode of operation, the write-in control signal CTL1 is shifted to the positive voltage level Vcc, and the variable voltage source Vx is supplied with the power voltage level Vcc. The write-in control signal CTL1 of the positive voltage level Vcc is directly supplied to the gate electrode of the n-channel enhancement type field effect transistor 2e, and the inverting circuit 2a supplies the complementary write-in control signal CCTL1 of the ground voltage level to the gate electrode of the n-channel enhancement type field effect transistor 2d. The n-channel enhancement type field effect transistor 2e turns on to pull down the common drain node N2 to the ground voltage level, and the other n-channel enhancement type field effect transistor 2d turns off so that the common drain node N1 is lifted to the power voltage level Vcc. The p-channel enhancement type field effect transistors 2b and 2c maintain the voltage levels at the common drain nodes N1 and N2, and are relayed to the n-channel depletion type field effect transistors 1a and 1b, respectively. With the positive voltage level Vcc at the common drain node N1, the n-channel depletion type field effect transistor 1a remains in the on-state, however, the ground voltage level at the common drain node N2 allows the n-channel depletion type field effect transistor 1b to turn off. Then, the power voltage level Vcc is supplied to the memory circuits of the redundant unit as well as the data storage. With the power voltage level Vcc, the electrically programmable memory cells of the redundant unit to see whether or not an external address signal is indicative of the address assigned to one of the defective regular memory cells, and the redundant unit replaces the defective memory cell with a redundant memory cell.

However, a problem is encountered in the prior art electrically programmable read only memory device in trouble shooting. In detail, the prior art write-in voltage source supplies either write-in or power voltage level Vpp or Vcc depending upon the write-in control signal CTL1, and the write-in or power voltage level Vpp or Vcc is distributed to both of the memory circuits of the redundant unit and the data storage. If the write-in voltage level Vpp is selectively supplied to the memory circuits and the data storage, data bits can be written into defective regular memory cells regardless of the memory circuits of the redundant unit, and allows a trouble shooter to analyze the defective regular memory cells.

SUMMARY OF THE INVENTION

It is therefore an important object of the present invention provide a write-in voltage source which selectively supplies a write-in voltage level to a memory circuit and a data storage.

To accomplish the object, the present invention proposes to independently control two level-shifting circuits for selectively supplying three different voltage levels.

In accordance with the present invention, there is provided a write-in voltage source incorporated in an electrically erasable read only memory device, comprising: a) a first control circuit responsive to a first instruction signal indicative of a first or second voltage level, and producing first and second control signals complementary to each other; b) a second control circuit responsive to a second instruction signal indicative of a third voltage level, and producing third and fourth control signals complementary to each other; c) a first level-shifting circuit responsive to the first to third control signals, and producing one of the first to third voltage levels; and d) a second level-shifting circuit responsive to the first, second, and fourth control signals, and producing one of the first to third voltage levels.

BRIEF DESCRIPTION OF THE DRAWINGS

The feature and advantages of the write-in voltage source according to the present invention will be more clearly understood from the following description taken in conjunction with the accompanying drawings in which.

DESCRIPTION OF THE PREFERRED EMBODIMENTS

First Embodiment

Figure 1:
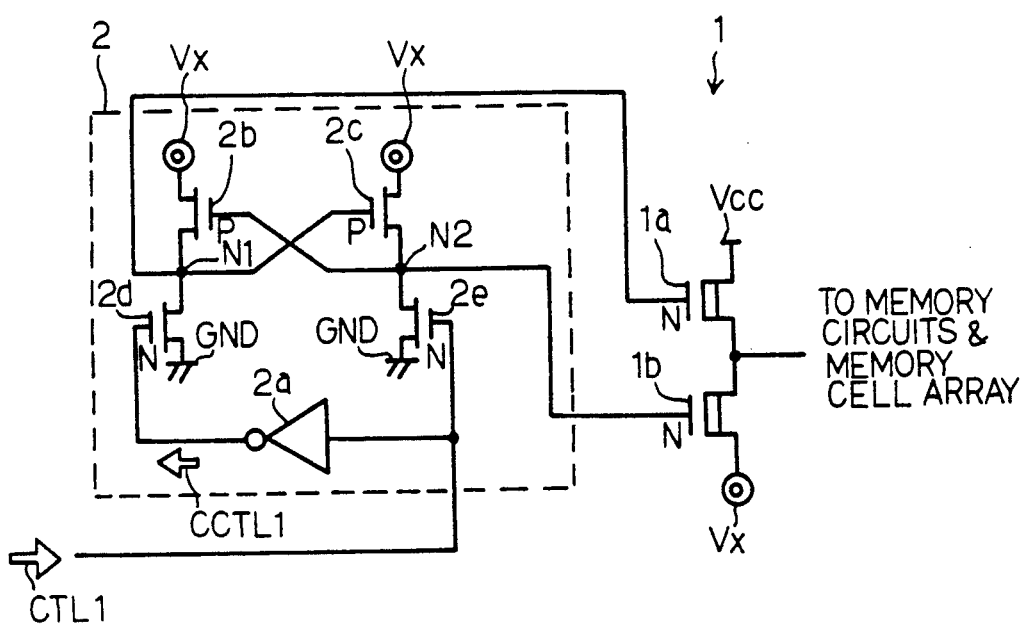
FIG. 1 is a circuit diagram showing the arrangement of the prior art write-in voltage source.
Figure 2:
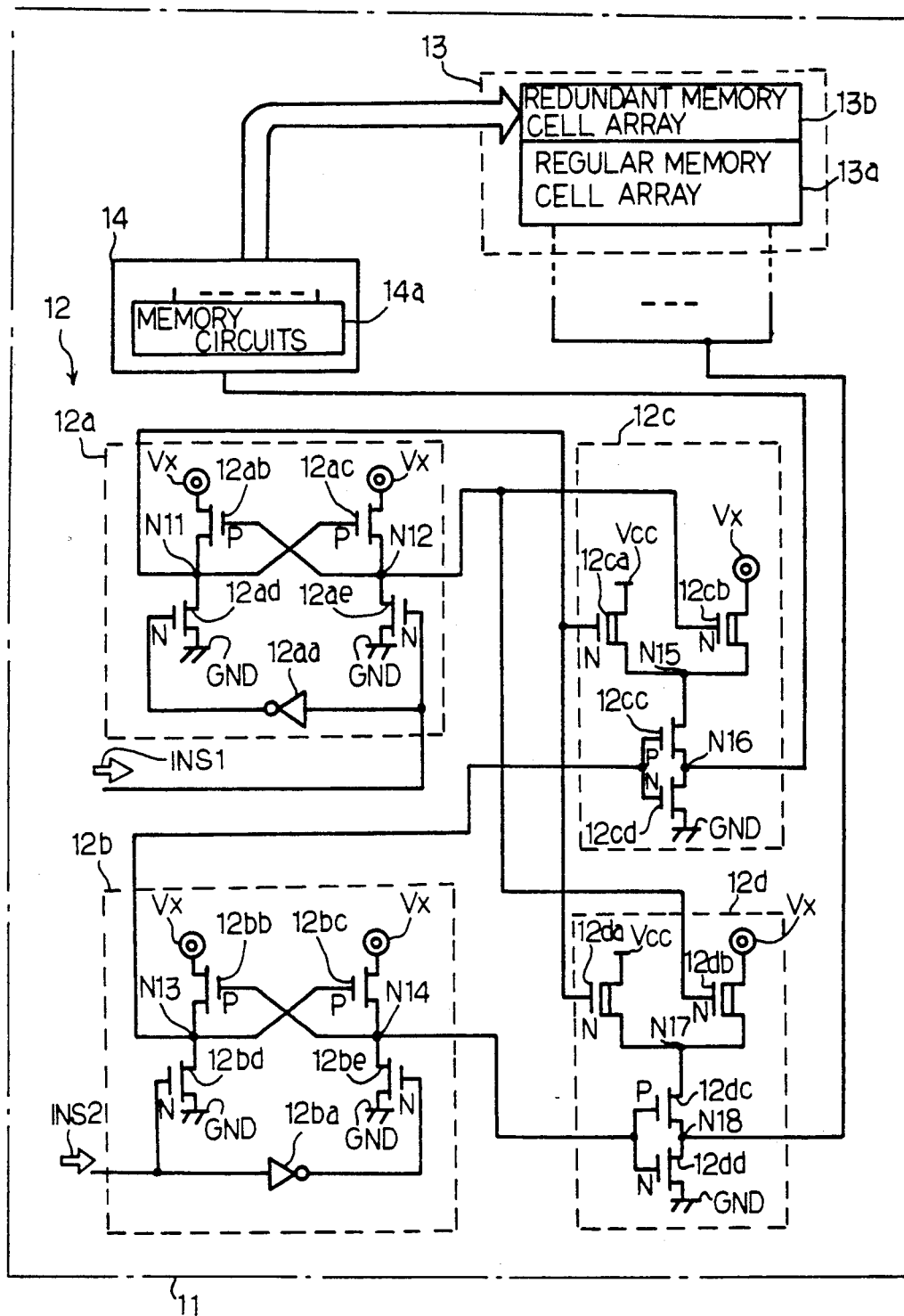
FIG. 2 is a circuit diagram showing the arrangement of a write-in voltage source incorporated in an electrically programmable read only memory device according to the present invention.

Referring first to FIG. 2 of the drawings, an electrically programmable read only memory device embodying the present invention is fabricated on a single semiconductor chip 11, and a write-in voltage source 12 is incorporated in the electrically programmable read only memory device. The electrically programmable read only memory device further comprises a data storage 13 having a regular memory cell array 13a and a redundant memory cell array 13b associated with various peripheral circuits (not shown) for a write-in phase and a read-out phase of operation, and the regular and redundant memory cell arrays 13a and 13b are implemented by electrically programmable read only memory cells. The redundant memory cell array 13b is further associated with a redundant unit 14 having memory circuits 14a, the memory circuits 14a implemented by electrically programmable read only memory cells. If a defective regular memory cell is found in a testing operation, the word line coupled with the defective regular memory cell is replaced with a redundant word line coupled with redundant memory cells of the redundant memory cell array 13b, and the row address assigned to the word line is stored in the memory circuits 14a. After the replacement, the redundant unit 14 monitors the address indicated by an external address signal, and the redundant word line is shifted to an active level instead of the word line coupled with the defective memory cell upon matching with the address stored in the memory circuits 14a.

An address is stored through selective write-in operation on the electrically programmable read only memory cells of the memory circuits 14a, and the selective write-in operation is carried out with a write-in voltage level Vpp supplied from the write-in voltage source 12. Similarly, data bits are stored in the regular memory cell array 13a and the redundant memory cell array 13b through an erasing operation followed by a selective write-in operation, and the write-in voltage level Vpp is supplied from the write-in voltage source 12.

In order to check to see whether or not the address indicted by the external address signal matches the address stored in the memory circuits 14a, the redundant unit 14 reads out the address from the memory circuits 14a, and the read-out operation on the memory circuits 14a is carried out with a read-out signal of a power voltage level Vcc. The power voltage level Vcc is regulated between the ground voltage level GND and the write-in voltage level, and is distributed by the write-in voltage source 12 instead of the write-in voltage level Vpp.

The write-in voltage source 12 largely comprises a first control circuit 12a, a second control circuit 12b, a first level-shifting circuit 12c and a second level-shifting circuit 12d. The first control circuit 12a is responsive to a first instruction signal INS1 internally produced on the basis of external signals, and comprises an inverting circuit 12aa and two series combinations of p-channel enhancement type field effect transistors 12ab and 12ac and n-channel enhancement type field effect transistors 12ad and 12ae coupled in parallel between a variable voltage source Vx and a source of ground voltage level GND. The gate electrodes of the n-channel enhancement type field effect transistors 12ad and 12ae are coupled with the output node and the input node of the inverting circuit 12aa, and the common drain nodes N11 and N12 are coupled with the gate electrodes of the p-channel enhancement type field effect transistors 12ac and 12ab, respectively. The write-in voltage level Vpp and the power voltage level Vcc are selectively supplied to the variable voltage source Vx, and the first control circuit 12a maintains the write-in, power and ground voltage levels at the common drain nodes N11 and N12 in a complementary manner depending upon the first instruction signal INS1. The voltage levels at the common drain nodes N11 and N12 are supplied to the first and second level-shifting circuits 12c and 12d as first and second control signals. In this instance, the write-in voltage level Vpp, the power voltage level Vcc and the ground voltage level GND respectively serve as first, second and third voltage levels.

The second control circuit 12b is responsive to a second instruction signal INS2 also internally produced on the basis of the external signals, and comprises an inverting circuit 12ba and two series combinations of p-channel enhancement type field effect transistors 12bb and 12bc and n-channel enhancement type field effect transistors 12bd and 12be coupled in parallel between the variable voltage source Vx and the source of ground voltage level GND. The gate electrodes of the n-channel enhancement type field effect transistors 12bd and 12be are coupled with the output node and the input node of the inverting circuit 12ba, and the common drain nodes N13 and N14 are coupled with the gate electrodes of the p-channel enhancement type field effect transistors 12bc and 12bb, respectively. The write-in voltage level Vpp and the power voltage level Vcc are selectively supplied to the variable voltage source Vx, and the first control circuit 12b maintains the write-in, power and ground voltage levels at the common drain nodes N13 and N14 in a complementary manner depending upon the second instruction signal INS2. The voltage levels at the common drain nodes N13 and N14 are supplied to the first and second level-shifting circuits 12c and 12d as third and fourth control signals.

The first level-shifting circuit 12c comprises an n-channel depletion type field effect transistor 12ca coupled between the source of power voltage level Vcc and a common drain node N15, an n-channel depletion type field effect transistor 12cb coupled between the variable voltage source Vx and the common drain node N15, and a series combination of a p-channel enhancement type field effect transistor 12cc and an n-channel enhancement type field effect transistor 12cd coupled between the common drain node N15 and the source of ground voltage level GND. The two n-channel depletion type field effect transistors 12ca and 12cb are gated by the first control circuit 12a with the first and second control signals, and either write-in voltage level Vpp or power voltage level Vcc is supplied to the common drain node N15. Both the p-channel enhancement type field effect transistor 12cc and the n-channel enhancement type field effect transistor 12cd are complementarily gated by the second control circuit 12b with the third signal, and allow the common drain node N16 to be conducted to the common drain node N15 or the source of ground voltage level GND. As a result, either write-in voltage level Vpp, power voltage level Vcc, or ground voltage level GND is supplied to the common drain node N16 and, accordingly, to the redundant unit 14 depending upon the combination of the first and second instruction signals INS1 and INS2.

The second level-shifting circuit 12d comprises an n-channel depletion type field effect transistor 12da coupled between the source of power voltage level Vcc and a common drain node N17, an n-channel depletion type field effect transistor 12db coupled between the variable voltage source Vx and the common drain node N17, and a series combination of a p-channel enhancement type field effect transistor 12dc and an n-channel enhancement type field effect transistor 12dd coupled between the common drain node N17 and the source of ground voltage level GND. The two n-channel depletion type field effect transistors 12da and 12db are also gated by the first control circuit 12a with the first and second control signals, and either write-in voltage level Vpp or power voltage level Vcc is supplied to the common drain node N17. Both the p-channel enhancement type field effect transistor 12dc and the n-channel enhancement type field effect transistor 12dd are complementarily gated by the second control circuit 12b with the fourth control signal, and allow the common drain node N18 to be conducted to the common drain node N17 or the source of ground voltage level GND. As a result, either write-in voltage level Vpp, power voltage level Vcc, or ground voltage level GND is supplied to the common drain node N18 and, accordingly, to the data storage 13 depending upon the combination of the first and second instruction signals INS1 and INS2.

The write-in voltage source 12 thus arranged behaves as follows. The variable voltage source Vx supplies the power voltage level Vcc in the read-out phase of operation and the write-in voltage level Vpp in the write-in phase of operation. If a diagnostic operation is carried out for a trouble shooting, by way of example, the electrically erasable programmable read only memory device selectively enters the write-in phase and the read-out phase of operation. However, the electrically erasable and programmable read only memory device embodying the present invention can carry out the diagnostic operation without writing any address into the memory circuits 14a.

In the read-out phase of operation on the redundant memory cell array 13b, the first level-shifting circuit 12c supplies the power voltage level Vcc to the memory circuits 14a, and the second level-shifting circuit 12d supplies the ground voltage level GND to the data storage 13. The first and second instruction signals INS1 and INS2 are lifted to the power voltage level Vcc. With the first instruction signal INS1 of the power voltage level Vcc, the n-channel enhancement type field effect transistor 12ae turns on, and the complementary signal of the first instruction signal INS1 allows the n-channel enhancement type field effect transistor 12ad to remain off. Then, the common drain node N11 is lifted to the power voltage level Vcc, and the ground voltage level GND takes place at the common drain node N12. Current passing through the p-channel enhancement type field effect transistor 12ab maintains the power voltage level Vcc at the common drain node N11, and the power voltage level Vcc at the common drain node N11 and the ground voltage level GND at the common drain node N12 are respectively supplied to the n-channel depletion type field effect transistors 12ca and 12da and the other n-channel depletion type field effect transistors 12cb and 12db, respectively. The n-channel depletion type field effect transistors 12cb and 12db turn off, and the n-channel depletion type field effect transistors 12ca and 12da are kept in the on-state. Therefore, the common drain nodes N15 and N17 are conducted to the source of power voltage level Vcc, and are cut from the variable voltage source Vx. However, even if the first instruction signal INS1 is decayed to the ground voltage level GND, the power voltage level Vcc is continuously supplied to the common drain nodes N15 and N17, because the power voltage level Vcc is supplied to the variable voltage source Vx. The second instruction signal INS2 of the power voltage level Vcc allows the n-channel enhancement type field effect transistor 12bd to turn on, and the complementary signal of the second instruction signal INS2 keeps the n-channel enhancement type field effect transistor 12be off. Then, the p-channel enhancement type field effect transistor 12bc turns on to keep the common drain node N14 in the power voltage level Vcc, and the power voltage level Vcc at the common drain node N14 causes the p-channel enhancement type field effect transistor 12bb to remain off. For this reason, the common drain node N13 is kept in the ground voltage level GND, and the ground voltage level GND and the power voltage level Vcc are respectively supplied to the first and second level-shifting circuits 12c and 12d. With the ground voltage level GND, the p-channel enhancement type field effect transistor 12cc turns on, and the power voltage level Vcc at the common drain node N15 is supplied to the common drain node N16. The power voltage level Vcc is used in the memory circuits 14a for reading out the address. On the other hand, the power voltage level Vcc allows the n-channel enhancement type field effect transistor 12dd to turn on, and the ground voltage level GND is supplied to the common drain node N17. The ground voltage level GND disenables the data storage 13. If the second instruction signal INS2 is decayed to the ground voltage level GND, the power voltage level Vcc is supplied to the data storage 13 for access to data bits stored in the regular memory cell array 13a, and the ground voltage level GND at the common drain node N16 does not cause the redundant unit 14 to activate the redundant memory cell array 13b.

In the write-in phase, while any regular memory cell is not replaced with a redundant memory cell, both of the first and second instruction signals INS1 and INS2 are in the power voltage level Vcc. With the first instruction signal INS1 of the power voltage level Vcc, the n-channel enhancement type field effect transistor 12ae turns on, and the complementary signal of the first instruction signal INS1 allows the n-channel enhancement type field effect transistor 12ad to remain off. Then, the common drain node N11 is lifted to the write-in voltage level Vpp, and the ground voltage level GND takes place at the common drain node N12. Current passing through the p-channel enhancement type field effect transistor 12ab maintains the write-in voltage level Vpp at the common drain node N11, and the write-in voltage level Vpp at the common drain node N11 and the ground voltage level GND at the common drain node N12 are respectively supplied to the n-channel depletion type field effect transistors 12ca and 12da and the other n-channel depletion type field effect transistors 12cb and 12db, respectively. The n-channel depletion type field effect transistors 12cb and 12db turn off, and the n-channel depletion type field effect transistors are kept in the on-state. Therefore, the common drain nodes N15 and N17 are conducted to the source of power voltage level Vcc, and are cut from the variable voltage source Vx. The second instruction signal INS2 of the power voltage level Vcc allows the n-channel enhancement type field effect transistor 12bd to turn on, and the complementary signal of the second instruction signal INS2 keeps the n-channel enhancement type field effect transistor 12be off. Then, the p-channel enhancement type field effect transistor 12bc turns on to keep the common drain node N14 in the write-in voltage level Vpp, and the write-in voltage level at the common drain node N14 causes the p-channel enhancement type field effect transistor 12bb to remain off. For this reason, the common drain node N13 is kept in the ground voltage level GND, and the ground voltage level GND and the write-in voltage level Vpp are respectively supplied to the first and second level-shifting circuits 12c and 12d. With the ground voltage level GND, the p-channel enhancement type field effect transistor 12cc turns on, and the power voltage level Vcc at the common drain node N15 is supplied to the common drain node N16. On the other hand, the write-in voltage level Vpp allows the n-channel enhancement type field effect transistor 12dd to turn on, and the ground voltage level GND is supplied to the common drain node N18.

If the write-in phase of operation is carried out for replacement of a defective memory cell with a redundant memory cell, the first instruction signal INS1 goes down to the ground voltage level, and the second instruction signal INS2 remains in the power voltage level Vcc. With the first instruction signal INS1 of the ground voltage level GND, the n-channel enhancement type field effect transistor 12ae turns off, and the complementary signal of the first instruction signal INS1 allows the n-channel enhancement type field effect transistor 12ad to turn on. Then, the common drain node N12 is lifted to the write-in voltage level Vpp, and the ground voltage level GND takes place at the common drain node N11. Current passing through the p-channel enhancement type field effect transistor 12ac maintains the voltage level at the common drain node N12, and the write-in voltage level Vpp at the common drain node N12 and the ground voltage level GND at the common drain node N11 are respectively supplied to the n-channel depletion type field effect transistors 12cb and 12db and the other n-channel depletion type field effect transistors 12ca and 12da, respectively. The n-channel depletion type field effect transistors 12cb and 12db turn on, and the n-channel depletion type field effect transistors are turned off. Therefore, the common drain nodes N15 and N17 are conducted to the variable voltage source Vx in the write-in voltage level Vpp, and are cut from the source of power voltage level Vcc. The second instruction signal INS2 of the power voltage level Vcc allows the n-channel enhancement type field effect transistor 12bd to turn on, and the complementary signal of the second instruction signal INS2 keeps the n-channel enhancement type field effect transistor 12be off. Then, the p-channel enhancement type field effect transistor 12bc turns on to keep the common drain node N14 in the write-in voltage level Vpp, and the write-in voltage level Vpp at the common drain node N14 causes the p-channel enhancement type field effect transistor 12bb to remain off. For this reason, the common drain node N13 is kept in the ground voltage level GND, and the ground voltage level GND and the write-in voltage level Vpp are respectively supplied to the first and second level-shifting circuits 12c and 12d. With the ground voltage level GND, the p-channel enhancement type field effect transistor 12cc turns on, and the write-in voltage level Vpp at the common drain node N15 is supplied to the common drain node N16. The write-in voltage level Vpp is used for memorizing the address assigned to the defective memory cell in the memory circuits 14a. On the other hand, the write-in voltage level Vpp allows the n-channel enhancement type field effect transistor 12dd to turn on, and the ground voltage level GND is supplied to the common drain node N18. The ground voltage level GND prevents the data storage 13 from the write-in operation.

In a testing operation, the data bits can be written into the data storage 13 without writing the address assigned to a defective regular memory cell into the memory circuits 14a. The variable voltage source Vx is supplied with the write-in voltage level, and the second instruction signal INS2 is decayed to the ground voltage level GND. With the second instruction signal INS2 of the ground voltage level GND, the n-channel enhancement type field effect transistor 12bd turns off, and the complementary signal of the second instruction signal INS2 allows the n-channel enhancement type field effect transistor 12be to turn on. The common drain nodes N13 of the write-in voltage level Vpp causes the p-channel enhancement type field effect transistor 12bc to turn off, and keeps the common drain node N14 in the ground voltage level GND. On the other hand, the ground voltage level GND at the common drain node N14 maintains the p-channel enhancement type field effect transistor 12bb in the on-state, and current from the variable voltage source Vx sustains the voltage level at the common drain node N13. The write-in voltage level Vpp at the common drain node N13 causes the n-channel enhancement type field effect transistor 12cd to turn on, and the ground voltage level GND is supplied through the n-channel enhancement type field effect transistor 12cd to the memory circuits 14a regardless of the first instruction signal INS1. In other words, no write-in operation is carried out on the memory circuits 14a regardless of the first instruction signal INS1.

However, the ground voltage level GND at the common drain node N14 allows the p-channel enhancement type field effect transistor 12dc to turn on, and the common drain nodes N17 and N18 are conducted to each other. If the first instruction signal INS1 is in the power voltage level Vcc, the ground voltage level GND at the common drain node N12 causes the n-channel depletion type field effect transistors 12db to turn off, and the write-in voltage level Vpp at the common drain node N11 allows the n-channel depletion type field effect transistor 12da to remain on. The common drain node N17 is supplied with the power voltage level Vcc which in turn is relayed through the p-channel enhancement type field effect transistor 12dc to the data storage 13. However, any data bit is written into the regular and redundant memory cell arrays 13a and 13b with the power voltage level Vcc. If, on the other hand, the first instruction signal INS1 is in the ground voltage level GND, the ground voltage level at the common drain node N11 causes the n-channel depletion type field effect transistor 12da to turn off, and the write-in voltage level Vpp at the common drain node N12 allows the n-channel depletion type field effect transistor 12db to remain on. The write-in voltage level Vpp is supplied to the common drain node N17, and the p-channel enhancement type field effect transistor 12dc relays the write-in voltage level to the common drain node N17 and, accordingly, to the data storage 13.

As will be understood from the foregoing description, the write-in voltage source according to the present invention selectively supplies the write-in voltage level Vpp to the data storage 13 and the redundant unit 14, and such a selective supply is convenient for a trouble shooting.

Second Embodiment

Figure 3:
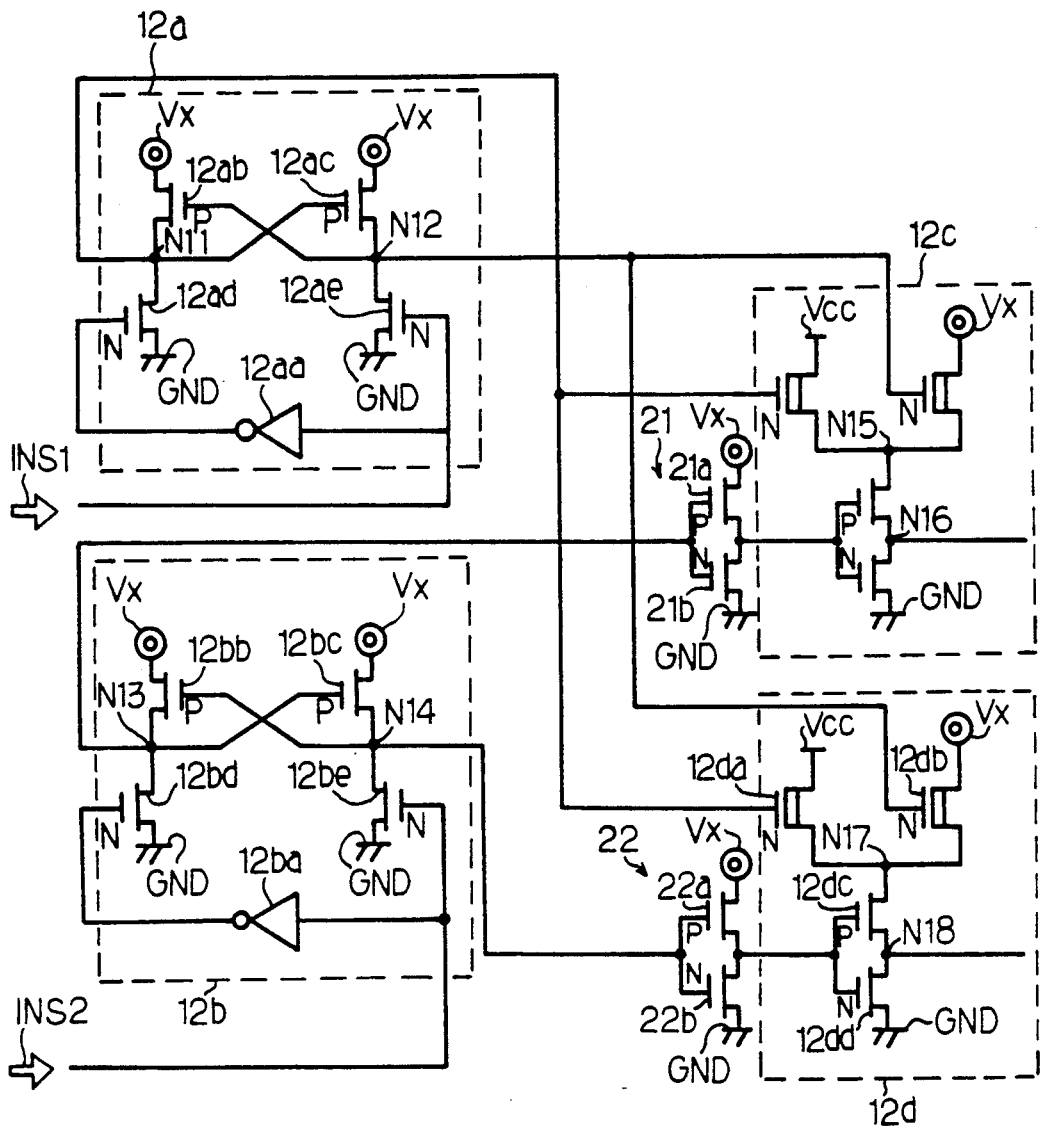
FIG. 3 is a circuit diagram showing the arrangement of another write-in voltage source according to the present invention.

Turning to FIG. 3 of the drawings, another write-in voltage source embodying the present invention is illustrated, and is similar to the write-in voltage source 12 except for inverting circuits 21 and 22 coupled between the second control circuit 12b and the first and second level-shifting circuits 12c and 12d. For this reason, the circuit components of the second embodiment are labeled with the references designating corresponding circuit elements of the first embodiment without detailed description. The inverting circuit 21 is implemented by a series combination of a p-channel enhancement type field effect transistor 21a and an n-channel enhancement type field effect transistor 21b coupled between the variable voltage source Vx and the source of ground voltage level GND. The common drain node N13 is coupled with the gate electrodes of the field effect transistors 21a and 21b, and the complementary signal of the third control signal is supplied from the inverting circuit 21 to the first level-shifting circuit 12c. The inverting circuit 22 is also implemented by a series combination of a p-channel enhancement type field effect transistor 22a and an n-channel enhancement type field effect transistor 22b coupled between the variable voltage source Vx and the source of ground voltage level GND. The common drain node N14 is coupled with the gate electrodes of the field effect transistors 22a and 22b, and the complementary signal of the fourth control signal is supplied from the inverting circuit 22 to the second level-shifting circuit 12d.

Although the combination of the first and second instruction signals INS1 and INS2 is different from that of the first embodiment, the write-in voltage source implementing the second embodiment behaves as similar to the first embodiment, and achieves the advantages. Detailed description is omitted for avoiding undesirable repetition.

Although particular embodiments of the present invention have been shown and described, it will be obvious to those skilled in the art that various changes and modifications may be made without departing from the spirit and scope of the present invention. For example, the write-in voltage source according to the present invention is applicable with an electrically erasable and programmable read only memory device, and column addresses may be stored in the redundant unit for replacing regular digit lines with redundant digit lines.

What is claimed is:

1. A write-in voltage source incorporated in an electrically erasable programmable read only memory device, comprising:

a first control circuit responsive to a first instruction signal indicative of one of a first voltage level and a second voltage level, and producing first and second control signals complementary to each other for specifying said one of said first voltage level and said second voltage level;

b) a second control circuit responsive to a second instruction signal indicative of a source of a third voltage level, and producing third and fourth control signals complementary to each other;

c) a first level-shifting circuit responsive to said first, second and third control signals, and producing a first one of said first, second and third voltage levels; and d) a second level-shifting circuit responsive to said first, second and fourth control signals, and producing a second one of said first, second and third voltage levels different from said first one of said first, second and third voltage levels, one of said first and second level-shifting circuits serving as said source of said third voltage level.

2. A write-in voltage source as set forth in claim 1, in which said first control circuit comprises, a-1) a first inverting circuit supplied with said first instruction signal and producing the complementary signal of said first instruction signal;

a-2) a series combination of a first enhancement transistor of a first channel conductivity type and a second enhancement transistor of a second channel conductivity type coupled between a variable voltage source and said source of said third voltage level, said first and second voltage levels being selectively supplied to said variable voltage source; and a-3) a series combination of a third enhancement transistor of said first channel conductivity type and a fourth enhancement transistor of said second channel conductivity type coupled between said variable voltage source and said source of said third voltage level, said first and third enhancement transistors being gated by the drain nodes of said third and first enhancement transistors, respectively, said second and fourth enhancement transistors being gated by the output node and the input node of said first inverting circuit, respectively, said first and second control signals being produced at the drain nodes of said first and third enhancement transistors, respectively.

3. A write-in voltage source as set forth in claim 2, in which said second control circuit comprises, b-1) a second inverting circuit supplied with said second instruction signal and producing the complementary signal of said second instruction signal;

b-2) a series combination of a fifth enhancement transistor of said first channel conductivity type and a sixth enhancement transistor of said second channel conductivity type coupled between said variable voltage source and said source of said third voltage level; and b-3) a series combination of a seventh enhancement transistor of said first channel conductivity type and an eighth enhancement transistor of said second channel conductivity type coupled between said variable voltage source and said source of said third voltage level, said fifth and seventh enhancement transistors being gated by the drain nodes of said seventh and fifth enhancement transistors, respectively, said sixth and eighth enhancement transistors being gated by the input node and the output node of said second inverting circuit, said third and fourth control signals being produced at the drain nodes of said first and third enhancement transistors.

4. A write-in source as set forth in claim 3, in which said first level-shifting circuit comprises c-1) a first depletion transistor of said first channel conductivity type coupled between a source of said second voltage level and a first common node, and gated with said first control signal;

c-2) a second depletion transistor of said first channel conductivity type coupled between said variable voltage source and said first common node, and gated with said second control signal; and c-3) a series combination of a ninth enhancement transistor of said second channel conductivity type and a tenth enhancement transistor of said first channel conductivity type coupled between said first common node and said source of said third voltage level, said ninth and tenth enhancement transistors being gated with said third control signal, said one of said first to third voltage levels being produced at the common drain node of said ninth and tenth enhancement transistors.

5. A write-in source as set forth in claim 4, in which said second level-shifting circuit comprises:

d-1) a third depletion transistor of said first channel conductivity type coupled between said source of said second voltage level and a second common node, and gated with said first control signal;

d-2) a fourth depletion transistor of said first channel conductivity type coupled between said variable voltage source and said first common node, and gated with said second control signal; and d-3) a series combination of an eleventh enhancement transistor of said second channel conductivity type and a twelfth enhancement transistor of said first channel conductivity type coupled between said second common node and said source of said third voltage level, said eleventh and twelfth enhancement transistors being gated with said fourth control signal, said one of said first to third voltage levels being produced at the common drain node of said eleventh and twelfth enhancement transistors.

6. A write-in voltage source as set forth in claim 5, in which logic gates are coupled between said second control circuit and said first and second level-shifting circuits for supplying the complementary signals of said third and fourth control signals.

7. A write-in voltage source as set forth in claim 6, in which said logic gates are inverting circuits.

* * * * *